US 6,569,754 B2

(12) United States Patent
Wong et al.

(10) Patent No.: US 6,569,754 B2
(45) Date of Patent: May 27, 2003

(54) METHOD FOR MAKING A MODULE INCLUDING A MICROPLATFORM

(75) Inventors: Ark-Chew Wong, Irvine, CA (US); Clark T. -C. Nguyen, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 09/938,359

(22) Filed: Aug. 23, 2001

(65) Prior Publication Data

US 2002/0072163 A1 Jun. 13, 2002

Related U.S. Application Data

(60) Provisional application No. 60/227,506, filed on Aug. 24, 2000.

(51) Int. Cl.$^7$ ............................................... H01L 21/44
(52) U.S. Cl. ........................ 438/612; 438/106; 438/108
(58) Field of Search ................................ 438/106, 618, 438/108, 612

(56) References Cited

U.S. PATENT DOCUMENTS

| 5,796,714 A | * | 8/1998 | Chino et al. ................... 372/50 |
| 5,808,360 A | * | 9/1998 | Akram ........................ 257/738 |
| 5,869,894 A | * | 2/1999 | Degani et al. ............... 257/723 |
| 5,995,688 A | | 11/1999 | Aksyuk et al. |
| 6,214,644 B1 | * | 4/2001 | Glenn ......................... 438/108 |
| 6,300,161 B1 | * | 10/2001 | Goetz et al. ................. 438/106 |

FOREIGN PATENT DOCUMENTS

| EP | 0 773 436 A2 | 5/1997 |
| WO | WO 95/17014 | 6/1995 |

OTHER PUBLICATIONS

Markus, K. W., et al., Smart MEMS: Flip Chip Integration of MEMS And Electronics, XP–001039856, MEMS Technology Applications Center, North Carolina, Feb. 3, 1995.

Nguyen, Clark T.–C., Micromechanical Circuits For Communications, XP 008000467, University of Michigan, Ann Arbor, Michigan, Apr. 25, 2000.

Chavan, A.V., et al., A Monolithic Fully–Integrated Vacuum–Sealed CMOS Pressure Sensor, Ann Arbor, Michigan, Apr. 2000.

* cited by examiner

Primary Examiner—David Nelms
Assistant Examiner—Thao Le
(74) Attorney, Agent, or Firm—Brooks & Kushman P.C.

(57) ABSTRACT

A module bonded together at a microplatform and an improved method for making the module are provided. The method includes providing a micromechanical device including a first substrate, the microplatform, a first plurality of bonding sites on the microplatform, a micromechanical structure fabricated and supported on the microplatform and a support structure to suspend the microplatform above the first substrate. The method further includes providing a transistor circuit wafer including a second plurality of bonding sites thereon and integrated BiCMOS transistor circuits. The first and second plurality of bonding sites are aligned and compression bonded so that the microplatform is both electrically and mechanically coupled to the second substrate to form the module. The platform carrier wafer can be torn off, leaving bonded platforms behind on the substrate wafer. This allows small form factor merging of the two different technologies.

17 Claims, 3 Drawing Sheets

METHOD FOR MAKING A MODULE INCLUDING A MICROPLATFORM

CROSS-REFERENCE TO RELATED APPLICATION

This application claims the benefit of U.S. provisional application Ser. No. 60/227,506, filed Aug. 24, 2000 and entitled "Bonded Microplatform Process For Technology Merging."

STATEMENT REGARDING FEDERALLY SPONSORED RESEARCH OR DEVELOPMENT

This invention was made with government support under Contract No. F30602-97-2-0101 from DARPA. The government has certain rights in the invention.

BACKGROUND OF THE INVENTION

1. Field of the Invention

This invention relates to modules and methods for making same.

2. Background Art

Micromechanical ($\mu$mechanical) resonators and bandpass filters with frequencies in the low-UHF range (e.g., 35–300 MHz) have recently been demonstrated with performances that rival (and even better in some cases) those of bulky, off-chip crystal and SAW filters used in present-day wireless transceivers. By integrating these $\mu$mechanical devices together with transistor circuits using a merged MEMS/transistor process technology, single-chip RF MEMS front-ends using high performance super-heterodyne architectures may eventually become possible. The degree to which MEMS and transistor devices can be modularly combined is of utmost importance for RF MEMS applications, since the performance (e.g., Q, stability) of resonator devices is especially sensitive to fabrication conditions (e.g., temperatures, materials), which are often compromised in insufficiently modular merging processes.

Multichip Module (MCM) technology allows integrated circuits and passive devices to be mounted together on a common interconnecting substrate. Flip-chip solder-bump is a chip attachment technique in which pads and the surface of the chip have solder balls placed on them. The chips are then flipped and mated with an MCM or a PCB, and the soldered reflowed to create a solder joint. This technology has demonstrated promising results for high performance, high frequency MCM-based microprocessors. In MCMs, separate chip modules are flip-chip bonded to a larger substrate to form a complete system, where interconnects and signal lines between modules are formed directly on the substrate. The modules are bonded to the pads on the substrate using either solder or gold bumps, which are normally deposited via evaporation or electroplating.

U.S. Pat. No. 5,995,688 discloses a micro-opto-electromechanical device formed by a flip-chip bonding method.

U.S. Pat. No. 6,214,644 discloses a flip-chip micromachine package wherein a micromachine chip is mounted as a flip-chip to a substrate.

SUMMARY OF THE INVENTION

An object of the present invention is to provide an improved module and method of making same.

In carrying out the above object and other objects of the present invention, a method for making a module is provided. The method includes a) providing a device including a first substrate, a microplatform, at least one microplatform bonding site on the microplatform, a structure fabricated and supported on the microplatform, and a support structure to suspend the microplatform above the first substrate. The method also includes b) providing a second substrate including at least one circuit bonding site thereon and a circuit. The at least one microplatform bonding site is c) aligned with the at least one circuit bonding site and d) the at least one microplatform bonding site is bonded to the at least one circuit bonding site so that the microplatform is bonded to the second substrate at at least one bond.

The structure may be a micromechanical structure and the circuit may be an electronic circuit.

The device may have a plurality of microplatform bonding sites and the second substrate may have a plurality of circuit bonding sites so that the microplatform is bonded to the second substrate at bonds.

The micromechanical structure may be electrically coupled to the electronic circuit by one or more of the bonds.

The first and second substrates may be forced apart to break the support structure and separate the first substrate from the second substrate.

Bond pads and solder bumps may be formed on the second substrate wherein the bond pads serve as the second plurality of bonding sites.

The micromechanical structure may include at least one micromechanical resonator.

The micromechanical structure may be a micromechanical filter.

The at least one microplatform may be defined by a layer of a wafer.

The microplatform may be defined by a silicon device layer of an SOI wafer.

The support structure may include a plurality of tethers for suspending the microplatform above the first substrate.

The second substrate may be a wafer.

The at least one electronic circuit may be a transistor circuit such as a BiCMOS, CMOS, bipolar, SiGe or GaAs circuit.

The step of bonding may include the step of compression bonding and wherein the bonds are compression bonds.

If the device includes a plurality of microplatforms, steps c) and d) can be repeated with the second substrate or at least one other substrate.

The bonds may be selectively heated in a vacuum to vacuum encapsulate the micromechanical structure. Vacuum encapsulation can also be performed by burying the device under the platform under a layer of sealing material.

Further in carrying out the above object and other objects of the present invention, a module is provided. The module includes a device having a microplatform, at least one microplatform bonding site on the microplatform, and a structure fabricated and supported on the microplatform. The module also includes a second substrate including at least one circuit bonding site thereon and a circuit. The microplatform is coupled to the second substrate at the microplatform and circuit bonding sites such that the microplatform is in opposed and spaced relation to the second substrate.

The micromechanical structure may be vacuum encapsulated within a cavity defined by the microplatform and the second substrate.

Similar to the individual modules in MCMs, the micromechanical resonators are directly fabricated on microplatforms, which are flip-chip bonded to the bumps on the transistor circuit wafers, which are, in turn, connected to circuits via metal lines.

An aspect of the present invention is to provide a method for modularly merging two technologies via a process involving fabricating one technology on a platform suspended by tethers on a carrier substrate, then bonding the platform to a receiving substrate and tearing away the carrier substrate, leaving a bonded platform (on which devices in one technology are mounted) over and interconnected to devices in the other technology on the receiving substrate.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENTS

Figure 1A:
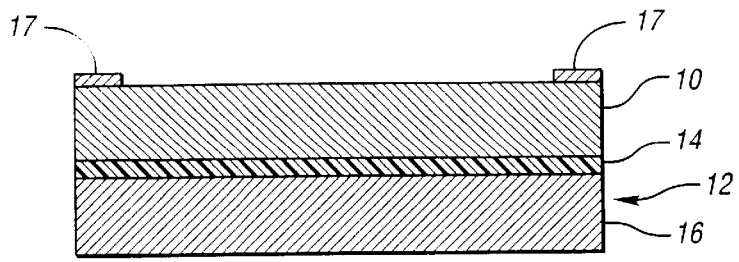
FIG. 1a is a side sectional schematic view of a first device illustrating LOCOS nitride deposition and patterning.

In general, FIGS. 1a–1j present the process flow of a flip-chip bonding process of the present invention and resulting module. In order to avoid microphonics and reduce energy losses through the platform to the substrate, a thick and large platform is desirable such that the resonance frequency of the platform does not interfere with that of the micromechanical devices. More generally, the platform structure and design is best when its acoustic impedance is such that energy loss from the mounted resonator to the substrate is minimized. The microplatform is realizable using an SOI approach, where the platform is defined by a silicon device layer 10, which is about 20 $\mu$m thick, of an SOI wafer, generally indicated at 12. A buried oxide layer 14 (BOX) of the SOI wafer 12 is a 2 $\mu$m layer 14 of thermal or deposited oxide, and serves as a sacrificial layer. The wafer 12 also includes a silicon substrate 16 as shown in FIG. 1a.

A 2000 Å thick LOCOS nitride layer 17 is first deposited on top of the SOI wafer 12. No pad oxide is required underneath the nitride layer 17 to reduce mismatch induced damage because the device layer is not used for transistors. Without the presence of a pad oxide, the bird's beak effect will be greatly minimized. To further minimize formation of a bird's beak, a thick nitride layer is preferred.

Figure 1B:
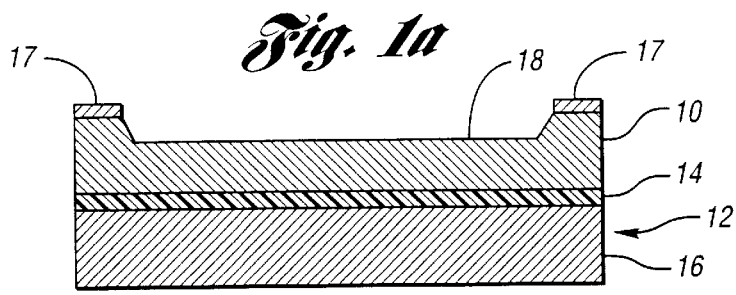
FIG. 1b is a side sectional schematic view of the first device showing an isolation trench etch.
Figure 1C:
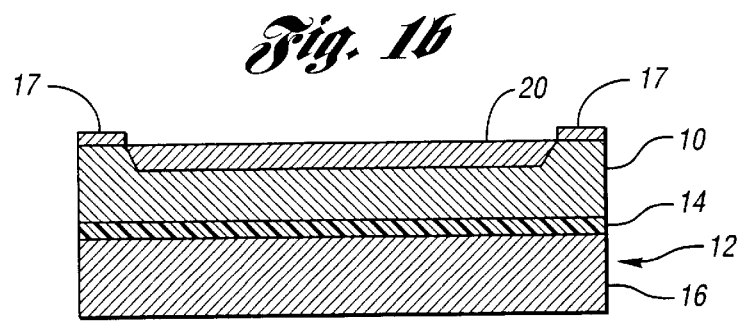
FIG. 1c is a side sectional schematic view of the first device showing a 2 $\mu$m isolation LOCOS oxide growth within the trench.
Figure 1D:
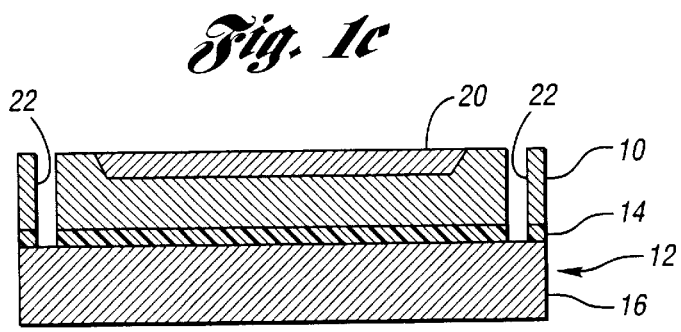
FIG. 1d is a side sectional schematic view of the first device showing stripped LOCOS nitride and an etched sealant trench.
Figure 1E:
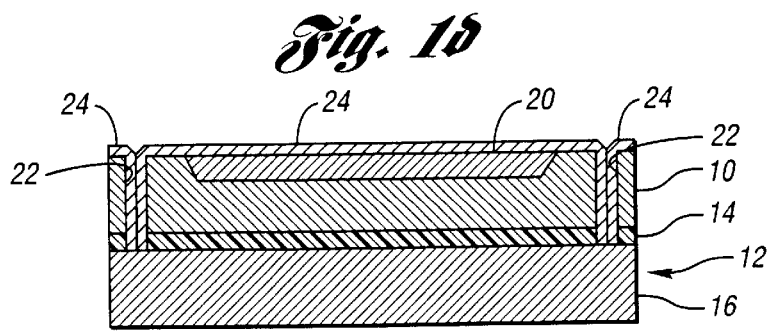
FIG. 1e is a side sectional schematic view of the first device showing the deposit of a 2 $\mu$m low stress nitride.
Figure 1F:
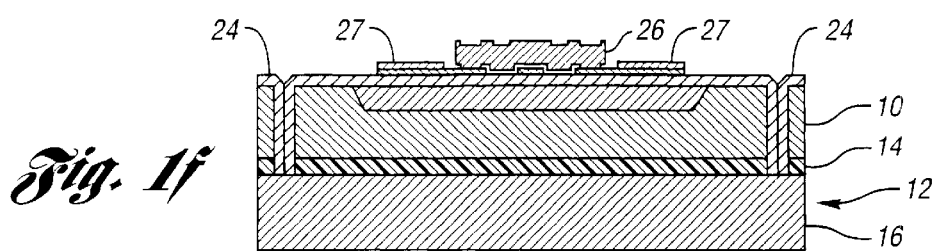
FIG. 1f is a side sectional schematic view of the first device showing the results of a surface micromachining process.

Next, the nitride layer 17 is patterned and etched, and a 1 $\mu$m deep trench 18 is formed in the layer 10 using RIE (FIG. 1b). This trench 18 defines an isolation region on which a resonator or filter will rest.

The trench 18 is refilled with 2 $\mu$m of thermal oxide 20 (FIG. 1c) using a LOCOS procedure. The LOCOS nitride prevents oxidation in the field area, and thus only the trench regions are oxidized. Topography is greatly reduced because the thick LOCOS nitride without a pad oxide prevents the formation of bird's beaks at the oxide-nitride interface.

Next, the LOCOS nitride layer is removed in a hot phosphoric acid solution. Using a photoresist mask, a 4 $\mu$m wide sealant trench 22 (or sealant ring) surrounding the isolation oxide region 20 (and surrounding the area of the eventual platform and its supports) is etched using an STS deep RIE (FIG. 1d), which utilizes the Bosch process for straight sidewall formation. The sealant trench etch is carefully characterized to prevent overetching of the Si layer 10, which can result in footing effects. Once the BOX layer 14 under the Si layer 10 is exposed, the presence of the oxide will cause the ions to ricochet against the sidewalls and undercut the Si layer 10, resulting in footings in the sidewalls.

Footings can be minimized using a two-step etching process in which the etching chemistry is altered once the etch front gets close to the oxide. In an actual demonstrated process, careful and thorough characterization of the STS deep RIE was carried out to ensure that the etch would stop directly on exposed oxide. Careful inspection of the sidewalls shows that scalloping occurred due to the Bosch process, which alternates between etch and passivation cycles.

The oxide layer 14 in the sealant trench 22 is removed next using a combination of dry and wet etch. Initially, the oxide 14 is etched using RIE with low pressure and high power settings to insure directivity. The last remaining 1000 Å of oxide 14 is removed using a 1:10 HF:DI water solution in order to prevent polymerization on the exposed Si layer 16. The hydrophobic sidewall of the trenches 22 presents a bottleneck for the HF solution, which beads up upon contact to exposed Si. To alleviate the situation, Triton X is added to the HF solution to reduce the surface tension, making it more hydrophilic along the sidewalls. Initial dewetting of the surface with DI water and constant agitation during the etch also helps to speed up the etch front. The sealant trench 22 is separated from the oxide isolation layer 20 by about 15 $\mu$m.

Next, the trench 22 is refilled with 2 $\mu$m of low stress nitride 24 (FIG. 1e), which completely blankets the wafer. Using LPCVD, the nitride 24 is deposited uniformly and conformally, and footings do not pose any major threats to the sealing. The nitride 24 serves as anchors for the platform, as well as an isolation layer. The nitride seal 24 also protects the oxide underneath the field area during release, providing additional stability and support to the released platforms.

Using a conventional micromachining process, one or more micromechanical devices 26, such as resonators or a filter, or a mixer-filter, and conductive pads 27 are fabricated.

The resonators 26 are released in a surfactant-enriched straight HF solution, then interconnects and bonding pads are metallized using a lift-off procedure. An optional supercritical $CO_2$ cleaning step can be performed at this point to purge away contaminants.

The process may be done by one of two methods: 1) by releasing the structure first, protecting them with PR, then continuing with the rest of the process; or 2) by keeping the sacrificial oxide intact during delineation of the platform, then releasing both the platform and resonator all at once.

Figure 1G:
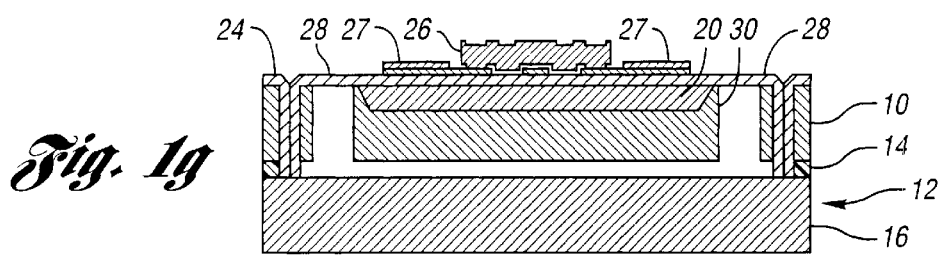
FIG. 1g is a side sectional schematic view of the first device showing platform release using dry and wet techniques.

As shown in FIG. 1g, tethers 28 for supporting all the four sides of a suspended platform 30 are patterned between the sealant ring 24 and the platform 30. A folded tether design is chosen to compensate for stress and temperature variations. Each tether 28 is folded symmetrically in both directions and sides, thus allowing for any changes due to stress and temperature variations to cancel out.

As part of method #1, a thick resist is used in this lithography step in order to protect the MEMs structures 26 against the subsequent long HF release step. Due to the large spring stiffness of beams of the resonators 26, the resonators 26 are not damaged or stuck down during lithography. Method #2 can be used if an HF-resistant metal is used for the micromechanical device interconnect.

To define the platform and its supports, the low stress nitride and Si layers 24 and 10, respectively, are etched using RIE and deep RIE, respectively, (FIG. 1g). The Si 10 under the nitride tethers 28 is removed using an optimized deep RIE etch recipe, which is intended for dry release of bulk micromachined devices. This step is best done using an isotropic recipe first until the nitride tethers are released, then using an anistropic deep RIE recipe until the POX oxide is reached. The oxide 14 underneath the platform 30 is removed using a surfactant-enriched straight HF solution. Upon release, the resist is removed and an important $CO_2$ cleaning step is performed to prevent stiction of the platform 30.

Figure 2:
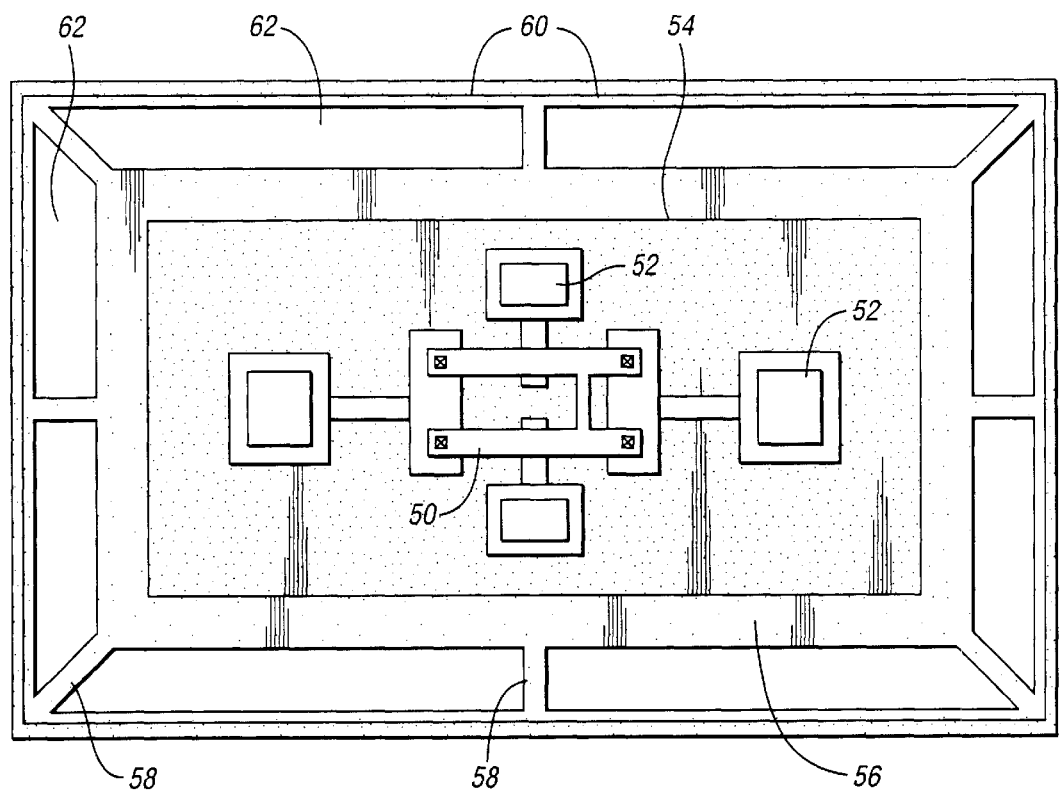
FIG. 2 is a top plan schematic view of the first device just prior to cold compression bonding.

FIG. 2 is a schematic top plan view of a resulting device which includes a micromechanical filter 50 and Cr—Cu bond pads 52 on a thermal oxide isolation layer 54. The layer 54, in turn, is supported on a nitride platform 56. Nitride tethers 58 suspend the platform 56 and extend toward nitride anchors 60 over a release trench 62.

Figure 1H:
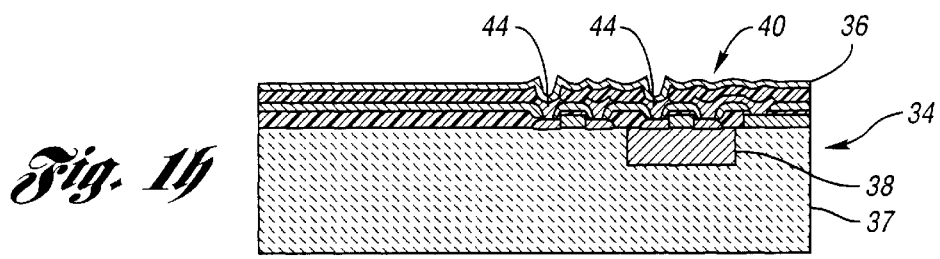
FIG. 1h is a side sectional schematic view of a second device showing deposit of a seed layer on a BiCMOS wafer.
Figure 1I:
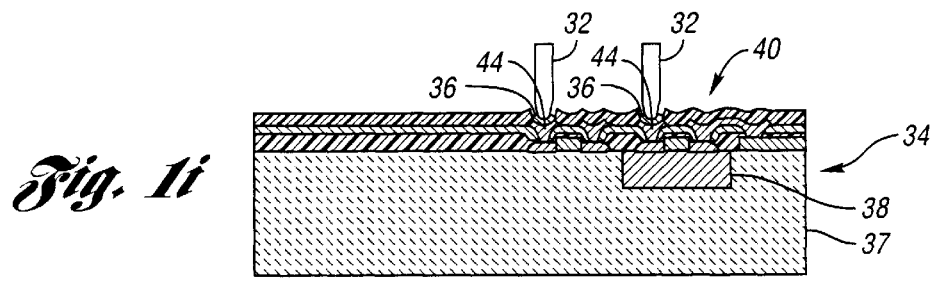
FIG. 1i is a side sectional schematic view of the second device after plating 7 $\mu$m of Indium.

Referring now to FIGS. 1h and 1i, since the platforms 30 on the MEMs wafers 12 are released prior to bonding, solder bumps 32 made of Indium are electroplated on a BiCMOS wafer, generally indicated at 34, instead. Indium is malleable, making compression bonding relatively easy, and with a melting point of 170° C., it is relatively easy to reflow without affecting the BiCMOS wafer 34.

Prior to formation of the bumps 32, a Cr—Cu seed layer 36 is sputtered on the BiCMOS wafer 34 (FIG. 1h). The wafer 34 also includes a substrate 37, a pwell 38, a transistor circuit 40, and metal interconnects 44.

Next, a plating mold is formed using a 10 $\mu$m thick photoresist. The indium bumps 32 approximately 25 $\mu$m wide and 7 $\mu$m tall are then electroplated, and the resist mold is removed. The Cu and Cr seed layers 36 are stripped using sulfuric peroxide and Cr etchant, respectively, but leaving behind portions of the layer 36 as pads for connecting to the bumps 32.

Figure 1J:
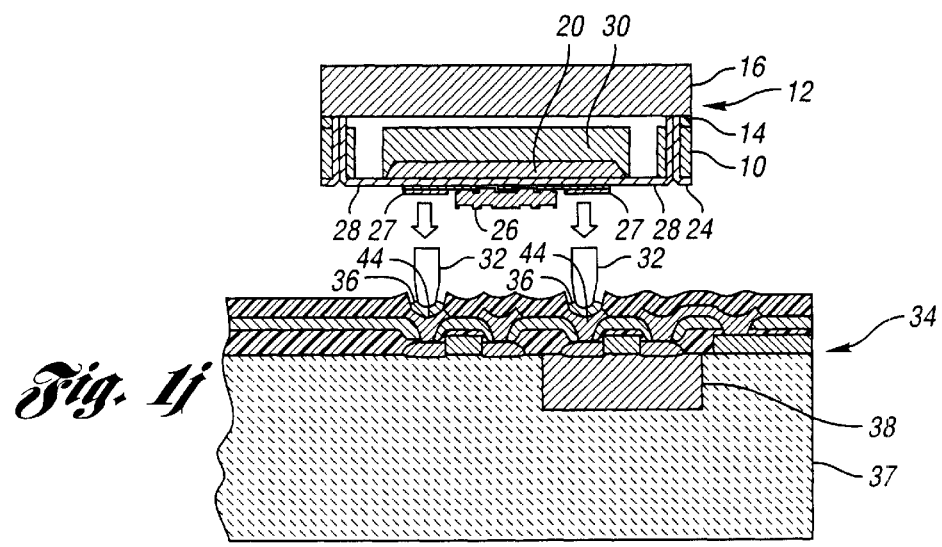
FIG. 1j is a side sectional schematic view of the two devices showing cold compression bonding thereof.

Using the EV Aligner-Bonder, cold-compression bonding is performed on both the MEMs and BiCMOS wafers 42 and 34, respectively (FIG. 1j). For Si—Si bonding, additional backside alignment marks (not shown) are needed on the MEMs wafer 12 to properly align the pads 27 to the pads 44 of the BiCMOS wafer 34. The alignment marks of the MEMs wafer 12 must be mirror-imaged to that of the lead wafer's marks. Although cold, after bonding the wafers 12 and 34 are separated by forcing the two wafers 12 and 34 apart, which allows a clean break of the tethers 28.

Alternatively, other types of bonding could be used such as eutectic bonding, anodic bonding, fusion bonding, etc.

Figure 3:
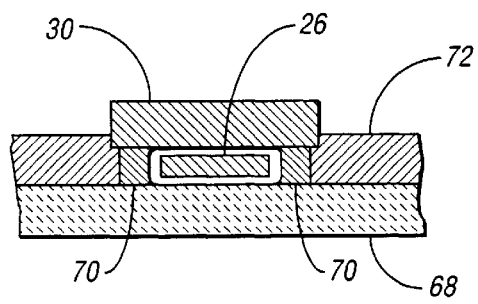
FIG. 3 is a side view, partially broken away and in cross-section, illustrating vacuum encapsulation and sealing of a micromechanical structure.

Referring now to FIG. 3, the present invention also includes the ability to do vacuum encapsulation after bonding the platform 30. If one bonds the platform 30 and second wafer 68 under vacuum, the solder can be selectively heated at bond points 70 in vacuum, thereby vacuum encapsulating the microstructure 26. In particular, the present invention also includes the ability to vacuum encapsulate mounted devices within the confines of the platform 30, the second wafer 68, and the bonding sites 70. In particular, if one of the bonding sites 70 is made to completely surround and encompass the devices mounted on the microplatform 30, then bonding around this site 70 can seal the devices 26 within the confines of the platform 30, bonding site 70, and second wafer 68. If this procedure is done under an inert atmosphere or under vacuum, then hermetic or vacuum encapsulation, respectively, can be achieved. Note that vacuum is best held if the type of bond formed during bonding is of high quality. Since higher temperature often makes possible high quality bonds, localized heated bonding techniques can be used to advantage for vacuum or hermetic encapsulation.

This invention also includes a new method for locally heating the bonding sites 70 that does not require routing of interconnect, nor any application of electrical signals to heat certain areas. This new localized heating method involves the use of a heating filament material in contact with the bonding solder(s) that is sensitive to and can be heated by a certain wavelength of light, and where this wavelength of light does not heat any other materials in the total structure (e.g., the platform, the second wafer, etc.). For example, SiGe might be used as the heating filament, where SiGe can be heated with a certain wavelength of light that does not heat Si alone. In this way, localized heating is generated by light alone, without the need for applied voltages or cumbersome heating filament interconnect (as required by previous localized heating methods).

Although localized heating is a useful technique, vacuum encapsulation can even be achieved without heating. In particular, vacuum encapsulation can be achieved by first compression bonding as described above, but with holes in the device-surrounding bonding site. Vacuum sealing of the holes can then be achieved by depositing an appropriate sealant material 72 over the platform 30 and second wafer 68, covering the holes, and sealing platform-mounted devices 26 under vacuum. For example, sealing can be achieved by evaporating aluminum over the platforms 30 to a thickness that covers the bond site holes. (Note that aluminum evaporation is done under 0.1 microTorr vacuum, so this automatically provides a good vacuum.)

Because it requires an SOI or similar starting wafer, it is easy to think that this technique could be expensive. In reality, however, the bonded-microplatform technique can be quite economical for cases where the area consumed by micromechanics is smaller than that consumed by transistor circuits. In particular, for these cases, platform/device layouts can be duplicated many times on the "MEMS" wafer, and then the "MEMS" wafer can be used to service as many transistor circuit wafers as there are duplications. For example, in such a scheme, a subset of platforms can be bonded to a transistor circuit wafer, then torn away, leaving those platforms on the transistor circuit wafer, but also leaving unbonded duplicates on the "MEMS" wafer. These unbonded platforms can then be used to service other transistor circuit wafers. The procedure for reusing a "MEMS" wafer over and over again can be implemented as a step and repeat process.

While the best mode for carrying out the invention has been described in detail, those familiar with the art to which this invention relates will recognize various alternative designs and embodiments for practicing the invention as defined by the following claims.

What is claimed is:

1. A method for making a module, the method comprising:
    a) providing a device including a first substrate, a microplatform, at least one bonding site on the microplatform, a structure fabricated and supported on the microplatform and a support structure to suspend the microplatform above the first substrate;
    b) providing a second substrate including at least one circuit bonding site thereon and a circuit;
    c) aligning the at least one microplatform bonding site with the at least one circuit bonding site; and
    d) bonding the at least one microplatform bonding site to the at least one circuit bonding site so that the microplatform is bonded to the second substrate at the at least one bond.

2. The method as claimed in claim 1 wherein the structure is a micromechanical structure and the circuit is an electronic circuit.

3. The method as claimed in claim 2 wherein the device has a plurality of microplatform bonding sites and the second substrate has a plurality of circuit bonding sites so that the microplatform is bonded to the second substrate at bonds and wherein the micromechanical structure is electrically coupled to the electronic circuit by at least one of the bonds.

4. The method as claimed in claim 1 further comprising forcing the first and second substrates apart to break the support structure and separate the first substrate from the second substrate.

5. The method as claimed in claim 4 wherein the device includes a plurality of microplatforms and wherein steps c) and d) are repeated with the second substrate or at least one other substrate.

6. The method as claimed in claim 3 further comprising forming bond pads and solder bumps on the second substrate wherein the bond pads serve as the circuit bonding sites.

7. The method as claimed in claim 3 wherein one of the microplatform bonding sites completely encases the structure so as to allow hermetic or vacuum encapsulation of the structure within.

8. The method as claimed in claim 2 wherein the micromechanical structure includes at least one micromechanical resonator.

9. The method as claimed in claim 8 wherein the micromechanical structure is a micromechanical filter.

10. The method as claimed in claim 1 wherein the microplatform is defined by a layer of a wafer.

11. The method as claimed in claim 10 wherein the microplatform is defined by a silicon device layer of an SOI wafer.

12. The method as claimed in claim 1 wherein the support structure includes a plurality of tethers for suspending the microplatform above the first substrate.

13. The method as claimed in claim 1 wherein the second substrate is a wafer.

14. The method as claimed in claim 13 wherein the at least one electronic circuit is a transistor circuit.

15. The method as claimed in claim 3 wherein the step of bonding includes the step of compression bonding and wherein the bonds are compression bonds.

16. The method as claimed in claim 3 further comprising selectively heating the bonds in a vacuum to vacuum encapsulate the micromechanical structure.

17. The method as claimed in claim 16 wherein the step of selectively heating includes the step of illuminating material comprising the bonds.

* * * * *